(12) United States Patent
Matsuzawa et al.

(10) Patent No.: US 11,031,558 B2
(45) Date of Patent: Jun. 8, 2021

(54) P-TYPE SEMICONDUCTOR FILM CONTAINING HETEROFULLERENE, AND ELECTRONIC DEVICE

(71) Applicant: Panasonic Intellectual Property Management Co., Ltd., Osaka (JP)

(72) Inventors: Nobuyuki Matsuzawa, Osaka (JP); Masaru Sasago, Osaka (JP); Jun'ichi Naka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 9 days.

(21) Appl. No.: 16/635,021

(22) PCT Filed: Aug. 7, 2018

(86) PCT No.: PCT/JP2018/029502
§ 371 (c)(1),
(2) Date: Jan. 29, 2020

(87) PCT Pub. No.: WO2019/044412
PCT Pub. Date: Mar. 7, 2019

(65) Prior Publication Data
US 2020/0381626 A1     Dec. 3, 2020

(30) Foreign Application Priority Data

Aug. 31, 2017  (JP) .............................. JP2017-167846

(51) Int. Cl.
*H01L 51/00*       (2006.01)
*H01L 51/05*       (2006.01)

(52) U.S. Cl.
CPC ...... *H01L 51/0046* (2013.01); *H01L 51/0005* (2013.01); *H01L 51/0541* (2013.01)

(58) Field of Classification Search
CPC ............. H01L 51/0046; H01L 51/0541; H01L 51/008
See application file for complete search history.

(56) References Cited

U.S. PATENT DOCUMENTS

| 6,107,117 A | 8/2000 | Bao et al. |
| 6,326,640 B1 | 12/2001 | Shi et al. |
| 2010/0283047 A1 | 11/2010 | Facchetti et al. |
| 2016/0056383 A1 | 2/2016 | Bae et al. |

FOREIGN PATENT DOCUMENTS

| JP | 7-002507 | 1/1995 |
| JP | 9-232589 | 9/1997 |
| JP | 10-190001 | 7/1998 |
| JP | 2010-001236 | 1/2010 |
| JP | 2011-515505 | 5/2011 |

(Continued)

OTHER PUBLICATIONS

International Search Report of PCT application No. PCT/JP2018/029502 dated Nov. 6, 2018.

(Continued)

*Primary Examiner* — Anthony Ho
(74) *Attorney, Agent, or Firm* — Wenderoth, Lind & Ponack, L.L.P.

(57) ABSTRACT

A p-type semiconductor film including heterofullerene having a further sufficiently high hole mobility is provided. The p-type semiconductor film contains heterofullerene in which n+r number (where n and r are both positive odd numbers) of carbon atoms constituting a fullerene are substituted by n number of boron atom or atoms and r number of nitrogen atom or atoms.

4 Claims, 8 Drawing Sheets

(56) References Cited

FOREIGN PATENT DOCUMENTS

| JP | 2015-054855 | 3/2015 |
|----|-------------|--------|
| JP | 2016-521263 | 7/2016 |

OTHER PUBLICATIONS

Jayasree Pattanayak et al., "Boron-Nitrogen (BN) Substitution Patterns in C/BN Hybrid Fullerenes: $C_{60-2x}(BN)_x(x=1-7)$", J. Phys. Chem. A, 2001, vol. 105, pp. 8376-8384.

David R. Evans et al., "Estimation of charge carrier mobility in amorphous organic materials using percolation corrected random-walk model", Organic Electronics 29 (2016), p. 50.

K. J. Bowers et al., "Scalable Algorithms for Molecular Dynamics Simulations on Commodity Clusters", Proceedings of the 2006 ACM/IEEE Conference on Supercomputing, ACM, Tampa, Florida, 2006, p. 84.

A. D. Bochevarov et al., "Jaguar: A High-Performance Quantum Chemistry Software Program with Strengths in Life and Materials Sciences", International Journal of Quantum Chemistry, 113 (2013), p. 2110.

Jun-ichi Aihara, "Kinetic Instability of Boron Heterofullerenes", Fullerene Science and Technology, 1999, vol. 7, No. 5, pp. 879-896, Especially Abstract, Figure 1 and Figure 2.

Zhongfang Chen et al., "Calculations on all possible isomers of the substituted fullerenes $C_{58}X_2$ (X=N, B) using semiempirical methods", J. Chem. Soc., Faraday Trans., 1998, vol. 94, No. 16, pp. 2269-2276, Especially Abstract and Table 1.

Heinrich R. Karfunkel et al., "Heterofullerenes: Structure and property predictions, possible uses and synthesis proposals", Journal of Computer-Aided Molecular Design, 1992, vol. 6, pp. 521-535, Especially Summary and Fig. 1.

m=60 m=70 m=60 m=70

P-TYPE SEMICONDUCTOR FILM CONTAINING HETEROFULLERENE, AND ELECTRONIC DEVICE

CROSS-REFERENCE TO RELATED APPLICATIONS

This application is a U.S. national stage application of the PCT International Application No. PCT/JP2018/029502 filed on Aug. 7, 2018, which claims the benefit of foreign priority of Japanese patent application 2017-167846 filed on Aug. 31, 2017, the contents all of which are incorporated herein by reference.

FIELD OF THE INVENTION

The present disclosure relates to a p-type semiconductor film containing heterofullerene, and to an electronic device.

DESCRIPTION OF THE RELATED ART

In recent years, there have been proposed many electronic devices, in particular, thin film transistors (abbreviated as TFT) in which an organic material is used as a formation material of a semiconductor layer (semiconductor film), and the thin film transistor is being actively studied. There are various advantages in using an organic material for a semiconductor layer. For example, while a conventional inorganic thin film transistor based on an inorganic amorphous silicon or the like needs a heating process at about 350° C. to 400° C., an organic TFT can be manufactured by a low-temperature heating process at about 50° C. to 200° C. Therefore, it is possible to manufacture an element on a more heat-labile base such as a plastic film. Further, it is also an advantage of organic materials that a large area device can be manufactured at a low cost by forming a semiconductor layer by using an easy forming method such as a spin coating method, an inkjet method, or a printing process.

One of indices for determining a performance of a TFT is carrier mobility of a semiconductor layer, and many studies have been made to improve carrier mobility of an organic semiconductor layer (organic semiconductor film) in an organic TFT. One of these studies that focuses on molecules of an organic material forming an organic semiconductor layer (organic semiconductor film) is a study in which, for example, poly(3-alkylthiophene) is used (see PTL 1). Further, an example of a study focusing on the structure of an organic TFT proposes that an alignment film is disposed between a gate insulation layer and an organic semiconductor layer so that a crystalline orientation of the organic semiconductor layer can be enhanced, whereby the carrier mobility is improved (see PTL 2). As described above, achieving an organic semiconductor having excellent properties and achieving a film of such an organic semiconductor lead to improvement in performances of electronic devices. For that purpose, it is necessary to study to improve the properties of organic semiconductors and films of such organic semiconductors.

In particular, as a p-type organic semiconductor material, benzothieno-benzothiophene (BTBT) and derivatives of the benzothieno-benzothiophene are known to have high carrier mobility (see PTLs 3 and 4).

CITATION LIST

Patent Literature

PTL 1: Unexamined Japanese Patent Publication No. H10-190001

PTL 2: Unexamined Japanese Patent Publication No. H9-232589

PTL 3: Unexamined Japanese Patent Publication No. 2010-1236

PTL 4: Unexamined Japanese Patent Publication No. 2015-54855

SUMMARY OF THE INVENTION

The inventors of the invention according to the present disclosure found that new issues as shown below would occur with conventional p-type organic semiconductor materials.

Molecular-based materials such as BTBT and derivatives of these materials are conventionally known, but those materials have hole mobility of at most about 5 cm$^2$/Vs to 10 cm$^2$/Vs. In this case, an element having a gate length of 10 μm has an operation speed of at most about 1 MHz. Almost the lower limit of the gate length formable by a coating method is 1 μm, and even such an element has an operation speed of at most about 10 MHz. Therefore, to achieve an operation speed of about 100 MHz, which is necessary for RF-ID (Radio Frequency Identifications), an organic semiconductor material having higher hole mobility has been required.

An object of the present disclosure is to provide a p-type semiconductor film containing heterofullerene having sufficiently high hole mobility and to provide an electronic device using the p-type semiconductor film.

The present disclosure provides a p-type semiconductor film containing heterofullerene in which n+r number (where n and r are both positive odd numbers) of carbon atoms constituting a fullerene are substituted by n number of boron atoms and r number of nitrogen atoms.

Since the heterofullerene of the present disclosure exhibits further sufficiently high hole mobility, a p-type semiconductor film containing the heterofullerene can improve frequency characteristics of an electronic device.

DETAILED DESCRIPTION OF THE PREFERRED EMBODIMENTS

[Heterofullerene]

Figure 1A:
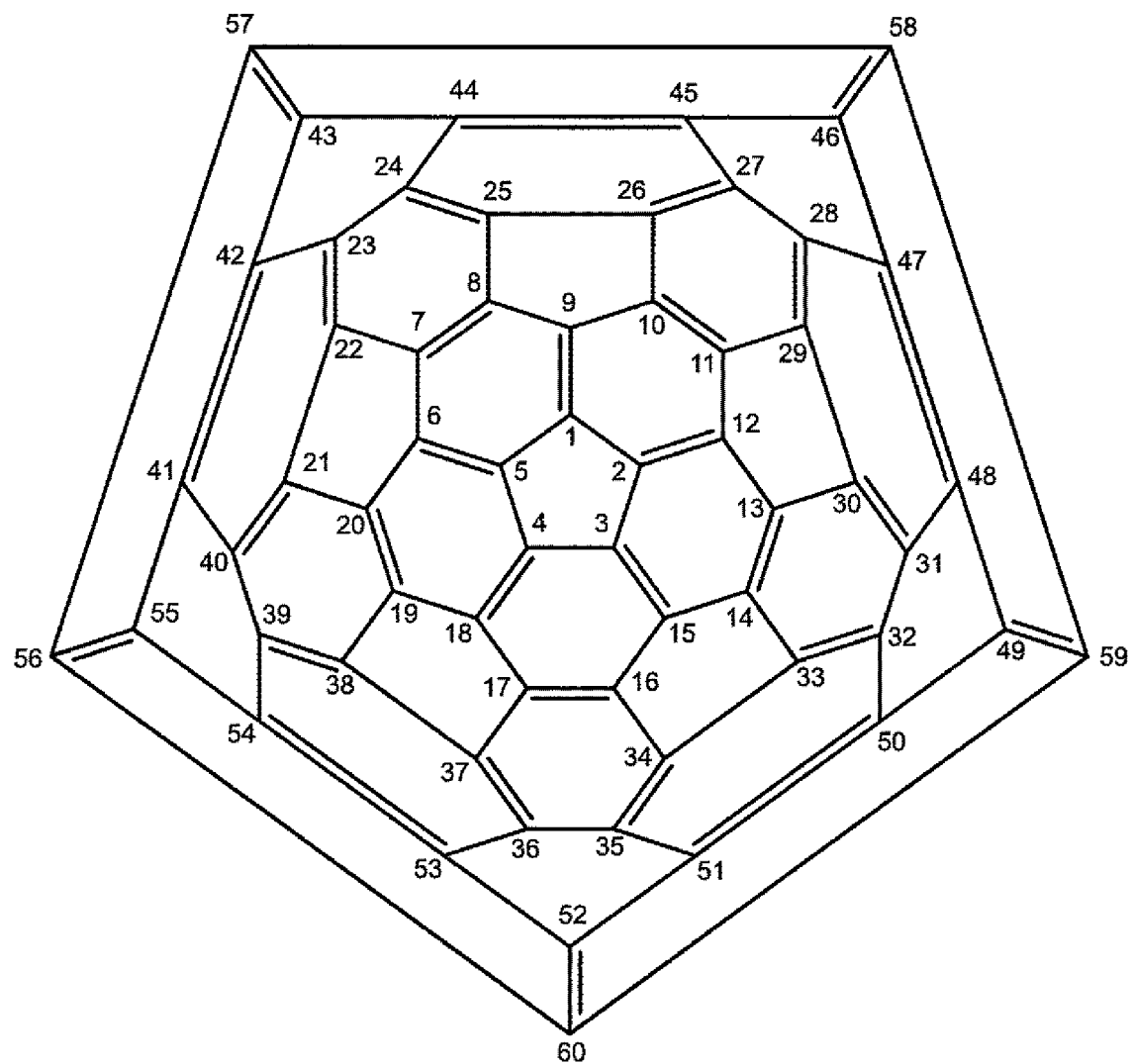
FIG. 1A is a schematic diagram for describing a notation system of substitution positions in a heterofullerene of the present disclosure when a skeleton-constituting atom number m of the heterofullerene is 60.

A heterofullerene of the present disclosure is a fullerene derivative containing a fullerene in which n+r number (where n and r are both positive odd numbers) of carbon atoms constituting a fullerene are substituted by n number of boron atoms and r number of nitrogen atoms. Since the carbon atoms to be substituted by n number of boron atoms and r number of nitrogen atoms constitute the fullerene skeleton, the n number of boron atoms and the r number of nitrogen atoms constitute the fullerene skeleton in the heterofullerene. Because the fullerene includes the n number of boron atoms and the r number of nitrogen atoms as the atoms constituting the fullerene skeleton, the hole mobility is increased. Each of the numbers n and r is a positive odd number independently selected from a group consisting of positive odd numbers, is preferably selected from a group consisting of odd numbers from 1 to 15, and is more preferably selected from a group consisting of odd numbers from 1 to 5. If one of or both of n and r are even numbers, is an odd number, there is an unpaired electron, and the compound is therefore unstable; therefore, the fullerene is not appropriate to be used for the heterofullerene of the present disclosure. From the point of view of further improvement in hole mobility, n and r preferably have the same value.

The heterofullerene of the present disclosure may have an organic group. The organic group is a pendant group that is directly connected to the carbon atom constituting the heterofullerene skeleton. The organic group is introduced by cleaving a π-bond between carbon atoms in the heterofullerene skeleton. The organic group may be any organic group. Specific examples of the organic group include, for example: an alkyl group such as methyl, an ethyl group, or a propyl group; a substituted alkyl group; a halogen group such as a fluoro group, a chloro group, or a bromo group; a benzyl group; a substituted benzyl group; a naphthyl group; and a substituted naphthyl group.

Hereinafter, the heterofullerene of the present invention containing, as heteroatoms, n number of boron atom or atoms and r number of nitrogen atom or atoms is referred to as "heterofullerene BN".

The heterofullerene BN of the present disclosure is a fullerene derivative, in which n+r number of carbon atoms constituting the fullerene are substituted by n number of boron atom or atoms and r number of nitrogen atom or atoms. The numbers n and r are respectively the same as the above-mentioned n and r. From the point of view of further improvement in the hole mobility in heterofullerene BN, n is preferably an odd number from 1 to 15, is more preferably an odd number from 1 to 5, and is further preferably an odd number from 1 to 3. From the same point of view, r is preferably an odd number from 1 to 15, is more preferably an odd number from 1 to 5, and is further preferably an odd number from 1 to 3. From the same point of view, n and r preferably have the same value. In the most preferable aspect of the embodiment, n and r are both 1.

The skeleton-constituting atom number m of the heterofullerene BN of the present disclosure is normally 60 or more for one molecule, and may be 60, 70, or 84, for example. From the point of view of a balance between further improvement in the hole mobility and reduction in a manufacturing cost, the skeleton-constituting atom number m of the heterofullerene BN is preferably 60 or 70. The skeleton-constituting atom number m of the heterofullerene BN exactly is a number of all the atoms constituting the heterofullerene skeleton, and is the same as a number of all the carbon atoms constituting the skeleton of the fullerene before substitution by a boron atom or atoms and a nitrogen atom or atoms, or is the same as the total number of the number of all the carbon atoms and the number of all the heteroatoms both constituting the skeleton of the heterofullerene BN.

Figure 1B:
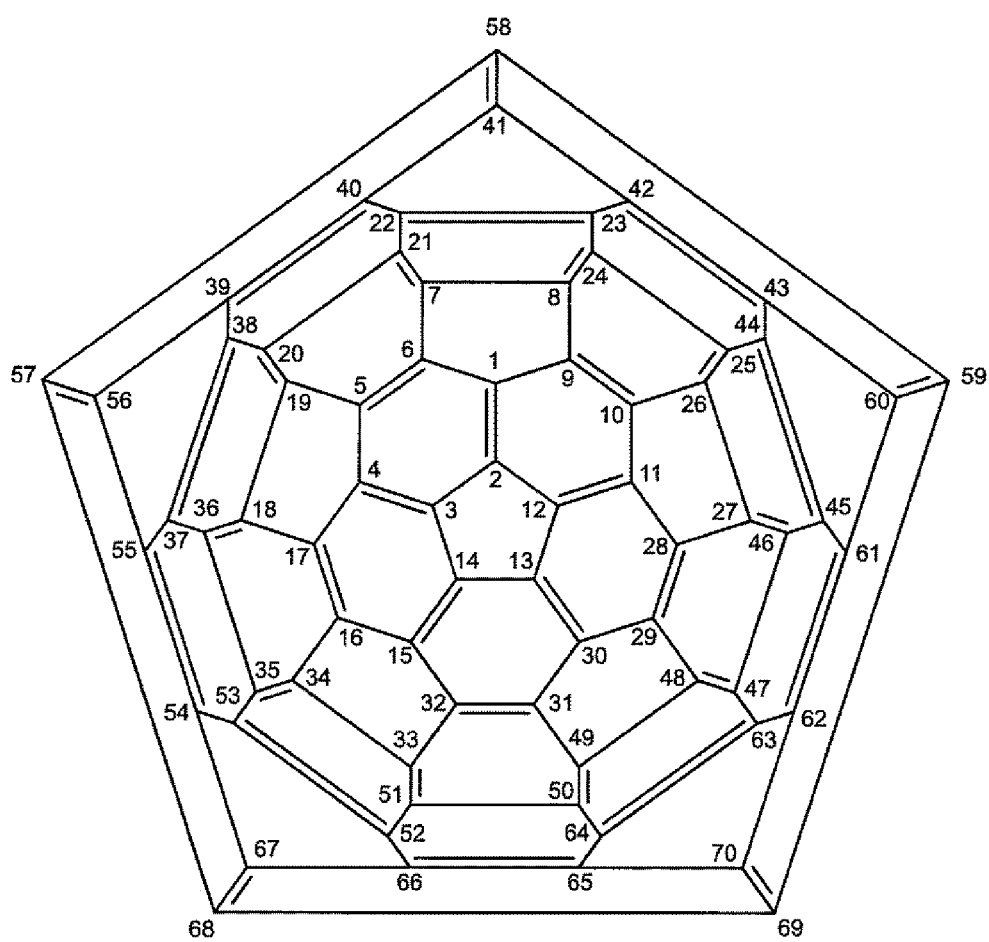
FIG. 1B is a schematic diagram for describing a notation system of substitution positions in a heterofullerene of the present disclosure when a skeleton-constituting atom number m of the heterofullerene is 70.

In the present specification, the substitution positions of heteroatoms in a heterofullerene BN with m=60 are in accordance with a Schlegel diagram shown in FIG. 1A. Further, the substitution positions of heteroatoms in a heterofullerene with m=70 are in accordance with a Schlegel diagram shown in FIG. 1B.

Figure 2A:
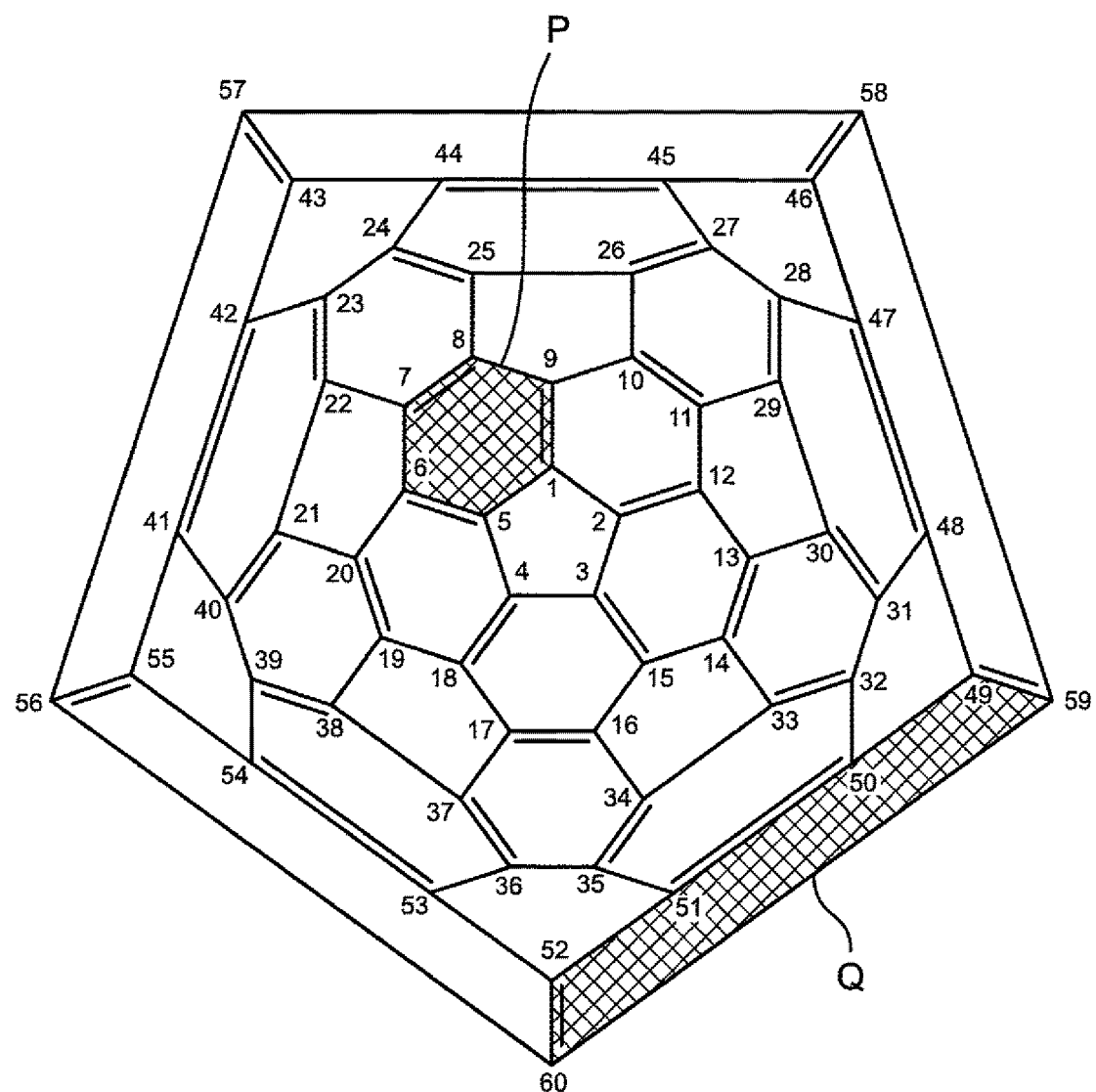
FIG. 2A is a schematic diagram for describing a notation system of preferable substitution positions in a heterofullerene of the present disclosure when a skeleton-constituting atom number m of the heterofullerene is 60.
Figure 2B:
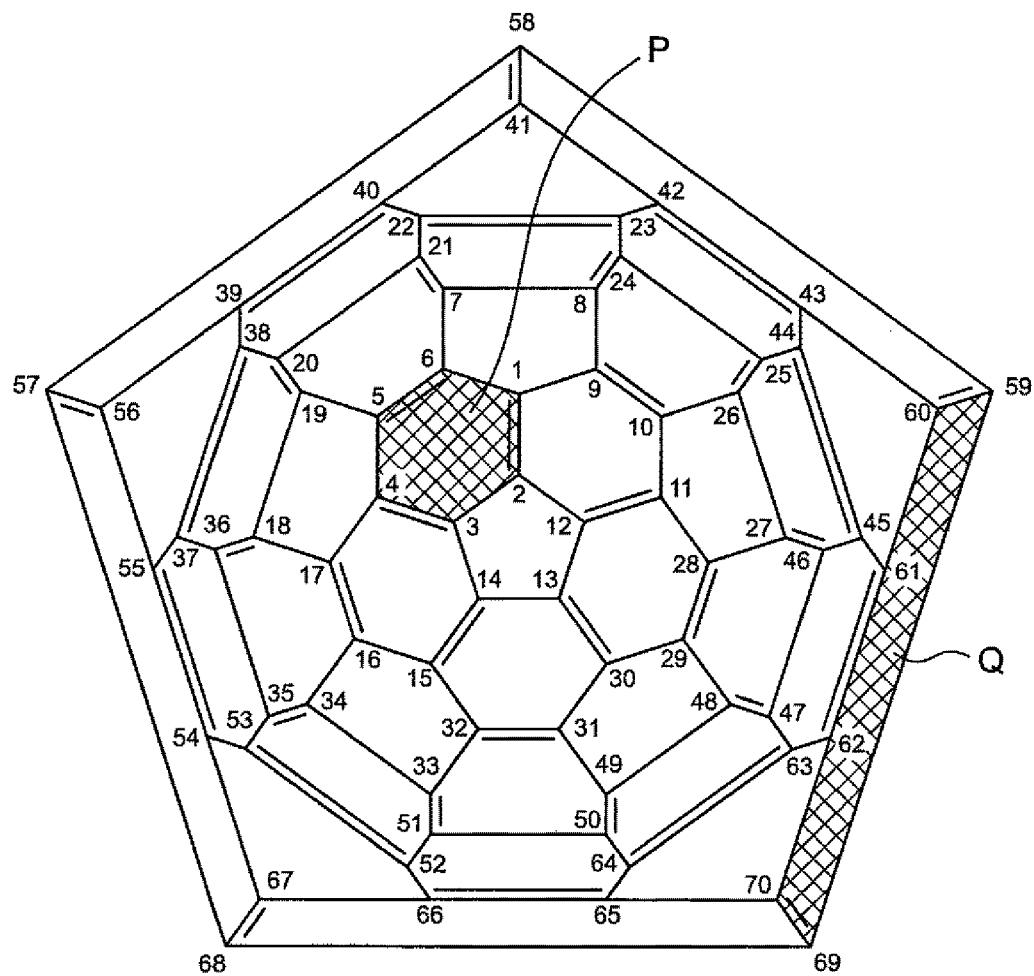
FIG. 2B is a schematic diagram for describing a notation system of preferable substitution positions in a heterofullerene of the present disclosure when a skeleton-constituting atom number m of the heterofullerene is 70.

There is no particular limitation to the substitution positions of the boron atom or atoms and the nitrogen atom or atoms as long as the boron atom or atoms and the nitrogen atom or atoms having substituted constitute the heterofullerene skeleton. From the point of view of further improvement in the hole mobility, the preferable substitution positions of the boron atom or atoms and the nitrogen atom or atoms are as follows. Note that in the following notations, any one of six-membered rings constituting a heterofullerene is referred to as a "six-membered ring P", and one six-membered ring located diametrically opposite to the six-membered ring P is referred to as a "six-membered ring Q". For example, if the heterofullerene is supposed as the Earth and the six-membered ring P is supposed as the North Pole, the six-membered ring Q corresponds to the South Pole. In detail, for example, in a heterofullerene with m=60, when the six-membered ring P is represented by "P" in FIG. 2A, the six-membered ring Q is disposed at "Q". Further, for example, in a heterofullerene with m=70, when the six-membered ring P is represented by "P" in FIG. 2B, the six-membered ring Q is disposed at "Q". The six-membered ring may be constituted only by carbon atoms or by carbon atoms and a heteroatom, or may be constituted only by heteroatoms.

In the case where n and r are both 1, regarding preferable substitution positions of one boron atom and one nitrogen atom, the substitution position of the one boron atom is one of the positions of the constituent atoms of the six-membered ring P, and the substitution position of the one nitrogen atom is any one of the positions of the constituent atoms of six-membered ring P (except the substitution position of the one boron atom) and the positions of the constituent atoms of the six-membered ring Q.

In the case of the heterofullerene BN with m=60, the positions of the constituent atoms of the six-membered ring P are the 1st, 5th, 6th, 7th, 8th, and 9th positions. In this case the positions of the constituent atoms of the six-membered ring Q are the 49th, 50th, 51st, 52nd, 59th, and 60th positions in the case of the heterofullerene BN with m=60.

In the case of the heterofullerene BN with m=70, the positions of the constituent atoms of the six-membered ring P are the 1st, 2nd, 3rd, 4th, 5th, and 6th positions. In this case the positions of the constituent atoms of the six-membered ring Q are the 59th, 60th, 61st, 62nd, 69th, and 70th positions in the case of the heterofullerene BN with m=70.

From the point of view of further improvement in hole mobility, the substitution position of the one boron atom is any one of the positions of the constituent atoms of the six-membered ring P (particularly, the 1st position), and the substitution position of the one nitrogen atom is any one of the positions of the constituent atoms of the six-membered ring P (except the substitution position of the one boron atom) and the positions of the constituent atoms of the six-membered ring Q (specifically, the substitution position is the 9th or 60th position in the case of m=60 and is the 2nd or 70th position in the case of m=70).

From the same point of view, it is more preferable that the substitution position of the one boron atom is any one of the positions of the constituent atoms of the six-membered ring P (particularly, the 1st position), and the substitution position of the one nitrogen atom is one of the positions of the constituent atoms of the six-membered ring P (except the substitution position of the one boron atom) (specifically, the substitution position is the 9th position in the case of m=60 and is the 2nd position in the case of m=70). In other words, the substitution positions of the one boron atom and the one nitrogen atom are selected from the positions of the constituent atoms of one identical six-membered ring of the six-membered rings constituting the heterofullerene BN. Alternatively, the substitution position of the one boron atom is any one of the positions of the constituent atoms of the six-membered ring P (particularly, the 1st position), and the substitution position of the one nitrogen atom is at the positions of the constituent atoms of the six-membered ring Q (specifically, the substitution position is the 60th position in the case of m=60 and is the 70th position in the case of m=70). That is, the substitution positions of the one boron atom and the one nitrogen atom are located diametrically opposite to each other.

Figure 3A:
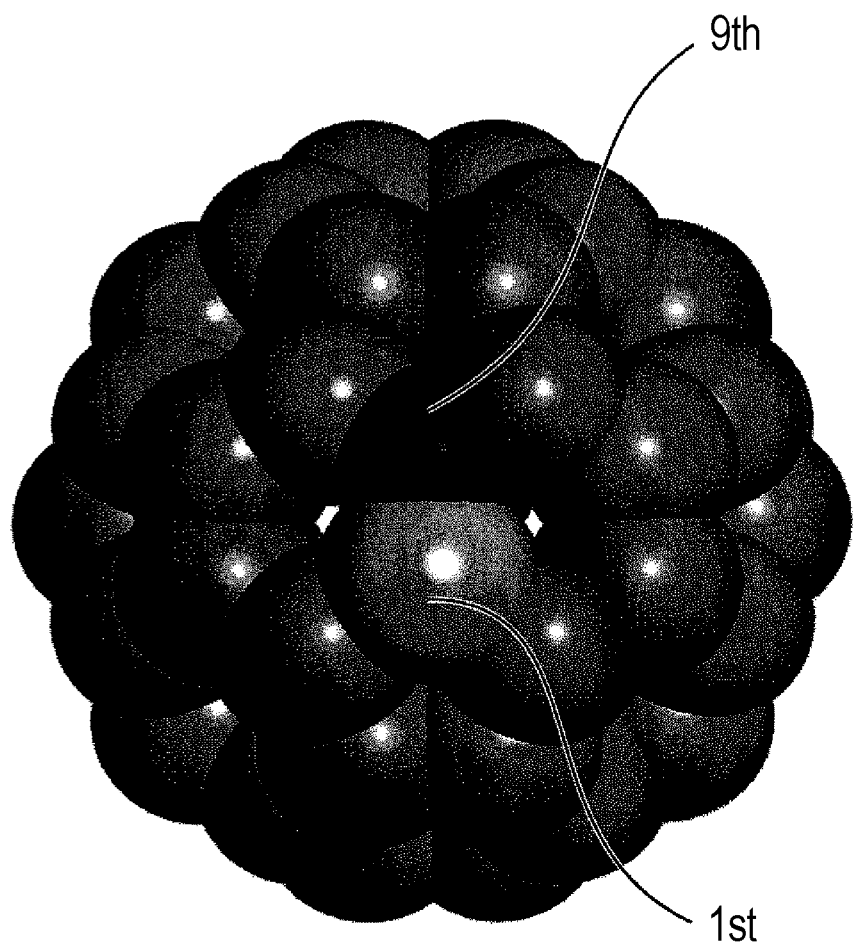
FIG. 3A is a diagram showing the relationship between the 1st position and the 9th position on a three-dimensional diagram of a heterofullerene $C_{58}N_1B_1$.
Figure 3B:
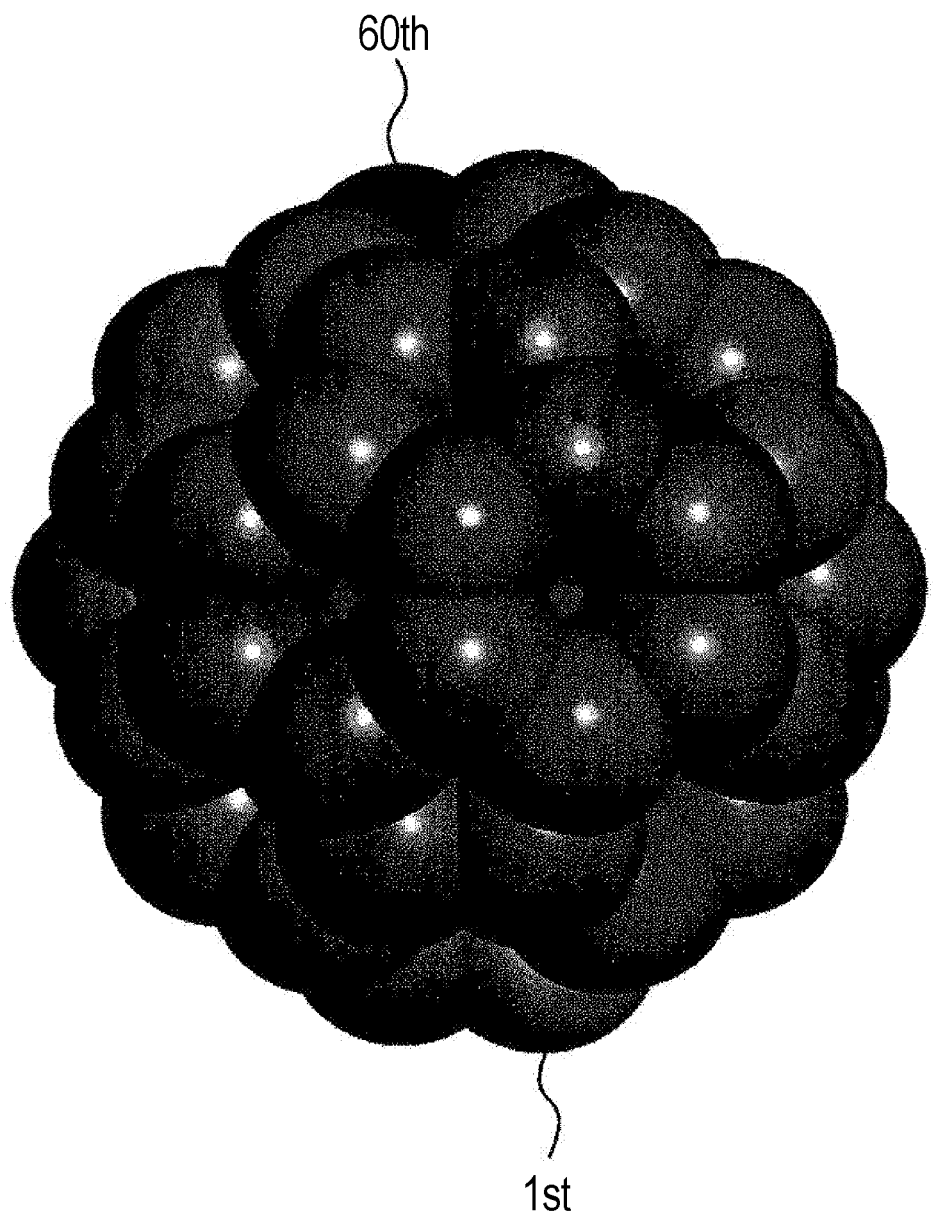
FIG. 3B is a diagram showing the relationship between the 1st position and the 60th position on a three-dimensional diagram of a heterofullerene $C_{58}N_1B_1$.

Specific examples of the preferable heterofullerene BN are as follows. The specific examples are represented as "the substitution position(s) of a boron atom or atoms, the substitution position(s) of a nitrogen atom or atoms-C:the number of carbon atoms:N:the number of nitrogen atom or atoms:B:the number of boron atom or atoms. For example, it is shown that compound 1 is heterofullerene constituted by 58 carbon atoms, one boron atom, and one nitrogen atom, for one molecule and that the substitution positions of the boron atom and the nitrogen atom respectively are the 1st and 9th positions.

m=60, n=1, r=1 compound 1: 1,9-$C_{58}N_1B_1$ compound 2: 1,60-$C_{58}N_1B_1$ m=70, n=1, r=1 compound 3: 1,2-$C_{68}N_1B_1$ compound 4: 1,70-$C_{68}N_1B_1$ FIG. 3A is a diagram showing the relationship between the 1st position and the 9th position on a three-dimensional diagram of heterofullerene $C_{58}N_1B_1$. FIG. 3A shows the 9th position, which is the substitution position of the nitrogen atom when the substitution position of the boron atom is assumed to be the 1st position. FIG. 3B is a diagram showing the relationship between the 1st position and the 60th position on a three-dimensional diagram of heterofullerene $C_{58}N_1B_1$. FIG. 3B shows the 60th position, which is the substitution position of the nitrogen atom when the substitution position of the boron atom is assumed to be the 1st position.

[Production Method of Heterofullerene BN]

The heterofullerene BN of the present disclosure can be produced, for example, by reaction of fullerene and boron nitride under irradiation of laser. In detail, the heterofullerene BN of the present invention can be produced by irradiation of laser light on a system of fullerene and boron nitride.

The system of fullerene and boron nitride may be a solvent system. In detail, a system in which fullerene and boron nitride are solved or are suspended and dispersed in a solvent may be used. A preferable system is a suspension obtained by putting boron nitride in a fullerene solution.

The fullerene is pure fullerene and may be $C_{60}$, $C_{70}$, and $C_{84}$, for example.

There is no particular limitation to a concentration of the fullerene in the system as long as an object heterofullerene BN can be obtained, and the concentration may be 0.01 wt % to 1 wt %, for example.

A high-purity boron nitride is preferably used, and as long as an object heterofullerene BN can be obtained, the boron nitride may contain impurity such as iron, chromium, nickel, or boron oxide.

The concentration of the boron nitride in the system may be appropriately selected depending on the number (percentage) of boron atoms and nitrogen atoms that substitute in the object heterofullerene BN (one molecule), and may be from 0.01 wt % to 1 wt %, for example.

There is no particular limitation to the solvent, and an organic solvent is normally used. The organic solvent may be an organic solvent such as hexane or toluene.

The laser light may be continuous light or pulsed light and is preferably pulsed light. As the laser light, excimer laser, nitrogen laser, or Nd:YAG laser can be used, for example. Regarding the wavelength, a wide range of wavelength can be used, and ArF laser and KrF laser can be used, for example.

The reaction temperature is not particularly limited and may be room temperature (25° C.), for example.

The reaction is preferably performed in an inert atmosphere and is preferably performed in an argon atmosphere or a nitrogen atmosphere, for example.

The irradiation time is not particularly limited and may be, for example, 0.5 hours to 10 hours as long as an object heterofullerene BN can be obtained.

After the reaction (irradiation), the solvent is extracted from a sediment, and the extraction liquid is subjected to separation and refinement using high-performance liquid chromatograph to obtain heterofullerene BN.

[Identification of Heterofullerene BN]

Even if several types of heterofullerene BNs are obtained in the above production method of heterofullerene BN, each type of heterofullerene can be separated and isolated depending on the types by performing the above separation and refinement process. In this case, if the above production process of heterofullerene BN is performed in a large scale, each type of heterofullerene BN can be easily separated and isolated.

The several types of heterofullerene BNs are the several types of heterofullerene BNs in which there is a difference in the number and/or substitution position of heteroatoms (boron atom and/or nitrogen atom) that substitute for one fullerene molecule.

Different types of heterofullerene BNs that are different in the number (per one molecule) of heteroatoms can be each identified by elemental analysis and mass spectrometry. In detail, the elemental analysis is used to identify the atoms constituting one molecular of heterofullerene, and the mass spectrometry is used to measure a molecular weight of the heterofullerene, so that a molecular formula of the heterofullerene can be determined. As a result, the heterofullerenes that are different in the number of heteroatoms can be each identified.

The heterofullerenes in which the substitution positions of the heteroatoms are different can be each identified by using $C^{13}$-nuclear magnetic resonance (NMR). In detail, by analysis of an amount of chemical shift of each peak obtained by C$^{13}$-NMR, the heterofullerene having different substitution positions of heteroatoms can be identified.

[Use of Heterofullerene BN]

The heterofullerene of the present disclosure has a further sufficiently high hole mobility and is therefore useful as a molecule-based organic semiconductor material or a carbon-based hole transfer material, in particular, a p-type semiconductor material. Therefore, when the heterofullerene BN of the present disclosure is used for an electronic device (electronic element) such as a transistor, a frequency characteristic of the electronic device can be improved.

Figure 4:
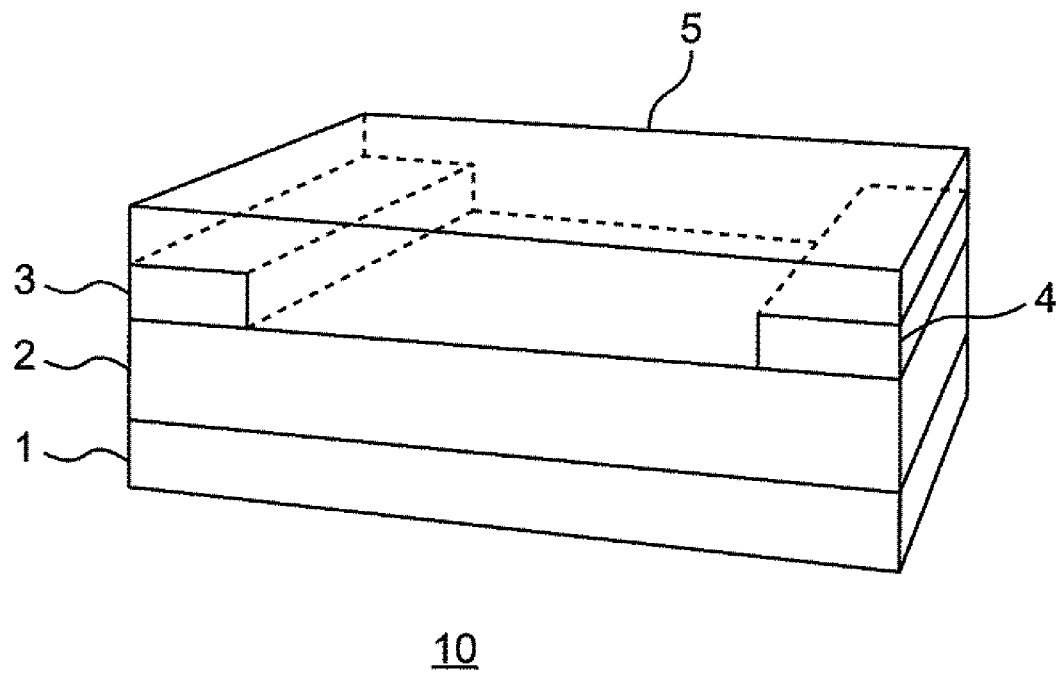
FIG. 4 is a schematic structural diagram showing an example of a basic structure of a transistor using the heterofullerene of the present disclosure.

FIG. 4 shows an example of a basic structure of a transistor using the heterofullerene BN of the present disclosure. With reference to FIG. 4, basic transistor structure body 10 includes:

gate electrode 1;

gate insulating film 2 formed on gate electrode 1;

source electrode 3 and drain electrode 4 separately formed on gate insulating film 2; and semiconductor film 5 formed in contact with an exposed area of gate insulating film 2 and in contact with source electrode 3, and drain electrode 4.

There is no particular limitation to a material that constitutes gate electrode 1 as long as the material is used as an electrode material in the field of electronic devices, and examples of the material include silicon, gold, copper, nickel, and aluminum.

There is no particular limitation to a material that constitutes gate insulating film 2 as long as the material has electrical insulation properties. Specific examples of the material that constitutes gate insulating film 2 include, for example: metal oxides or metal nitrides such as silicon oxide (such as $SiO_2$), silicon nitride (such as $Si_3N_4$), tantalum oxide (such as $Ta_2O_5$), aluminum oxide (such as $Al_2O_3$), titanium oxide (such as $TiO_2$), yttrium oxide (such as $Y_2O_3$), and lanthanum oxide (such as $La_2O_3$); and polymer materials such as epoxy resin, polyimide (PI) resin, polyphenylene ether (PPE) resin, polyphenylene oxide resin (PPO), and polyvinyl pyrrolidone (PVP) resin.

The material that constitutes source electrode 3 and drain electrode 4 may be the material exemplified as the material that constitutes gate electrode 1.

Semiconductor film 5 is a p-type semiconductor film containing the heterofullerene BN of the present invention. As long as semiconductor film 5 contains the heterofullerene BN of the present invention, semiconductor film 5 may contain other materials. For example, semiconductor film 5 may be constituted only by the heterofullerene BN of the present invention, or may contain fullerene, polythiophene, and condensed thiophene other than the heterofullerene BN of the present invention. A content amount of the heterofullerene BN of the present invention in semiconductor film 5 is, for example, higher than or equal to 0.1 mass %, in particular, is higher than or equal to 1 mass %, and, from the point of view of further improvement in the hole mobility, is preferably higher than or equal to 10 mass %, is further preferably higher than or equal to 50 mass %, and is most preferably 100 mass %.

Semiconductor film 5 can be formed by a method similar to a known method such as a vacuum vapor deposition method or a coating method other than by using heterofullerene BN of the present invention as a semiconductor material. In this case, by using only heterofullerene BN as a vapor deposition material in a vacuum vapor deposition method, it is possible to form a semiconductor film having a content amount of heterofullerene BN of 100 mass %.

Figure 5:
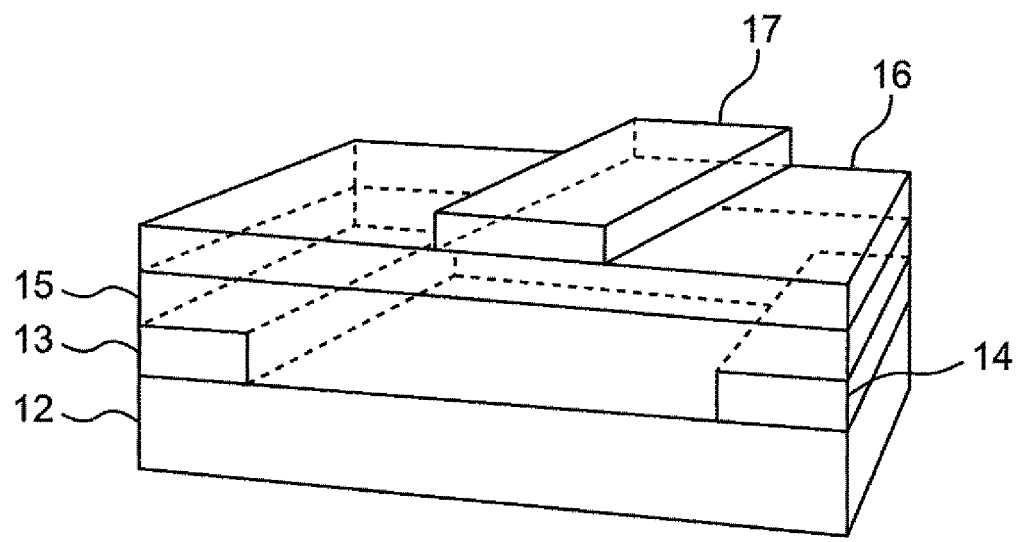
FIG. 5 is a schematic structural diagram showing an example of a basic structure of a transistor using the heterofullerene of the present disclosure.

FIG. 5 further shows an example of a basic structure of a transistor using the heterofullerene of the present disclosure. With reference to FIG. 5, basic transistor structure body 11 includes:

base substrate 12 having insulation properties;

source electrode 13 and drain electrode 14 separately formed on base substrate 12 having insulation properties;

semiconductor film 15 formed in contact with an exposed area of base substrate 12 having insulation properties and in contact with source electrode 13 and drain electrode 14;

gate insulating film 16 formed on semiconductor film 15; and gate electrode 17 formed at a position, on gate insulating film 16, between source electrode 13 and drain electrode 14 as viewed from above.

There is no particular limitation to the material constituting base substrate 12 having insulation properties as long as the material has electrical insulation properties. Specific examples of a material that constitutes base substrate 12 include, for example: metal oxides or metal nitrides formed on a silicon wafer such as silicon oxide (such as $SiO_2$), silicon nitride (such as $Si_3N_4$), tantalum oxide (such as $Ta_2O_5$), aluminum oxide (such as $Al_2O_3$), titanium oxide (such as $TiO_2$), yttrium oxide (such as $Y_2O_3$), and lanthanum oxide (such as $La_2O_3$); and polymer materials such as epoxy resin, polyimide (PI) resin, polyphenylene ether (PPE) resin, polyphenylene oxide resin (PPO), and polyvinyl pyrrolidone (PVP) resin.

The material that constitutes source electrode 13 and drain electrode 14 is not particularly limited as long as the material is used as an electrode material in the field of electronic devices, and examples of the material include silicon, gold, copper, nickel, and aluminum.

Semiconductor film 15 is a p-type semiconductor film containing the heterofullerene BN of the present disclosure. As long as semiconductor film 15 contains the heterofullerene BN of the present invention, semiconductor film 15 may contain other materials. For example, semiconductor film 15 may be constituted only by the heterofullerene BN of the present disclosure, or may contain fullerene, polythiophene, and condensed thiophene other than the heterofullerene BN of the present disclosure. A content amount of the heterofullerene BN of the present disclosure in semiconductor film 15 is, for example, higher than or equal to 0.1 mass %, in particular, is higher than or equal to 1 mass %, and, from the point of view of further improvement in the hole mobility, is preferably higher than or equal to 10 mass %, is further preferably higher than or equal to 50 mass %, and is most preferably 100 mass %.

There is no particular limitation to a material that constitutes gate insulating film 16 as long as the material has electrical insulation properties. Specific examples of the material that constitutes gate insulating film 16 include, for example: metal oxides or metal nitrides such as silicon oxide (such as $SiO_2$), silicon nitride (such as $Si_3N_4$), tantalum oxide (such as $Ta_2O_5$), aluminum oxide (such as $Al_2O_3$), titanium oxide (such as $TiO_2$), yttrium oxide (such as $Y_2O_3$), and lanthanum oxide (such as $La_2O_3$); and polymer materials such as epoxy resin, polyimide (PI) resin, polyphenylene ether (PPE) resin, polyphenylene oxide resin (PPO), and polyvinyl pyrrolidone (PVP) resin.

The material that constitutes gate electrode 17 may be the material exemplified as the material that constitutes source electrode 13 and drain electrode 14.

EXAMPLE

Experimental Example I

The present inventors calculated electron mobility of heterofullerene, based on molecular dynamics and molecular orbital calculation. As a calculation method of mobility, the method described in the following document was used: David R. Evans et al. Organic Electronics 29 (2016) 50. Specifically, a charge hopping rate ($\kappa$) required to calculate mobility is known to be given by the following equation.

[Mathematical Expression 1]

$$\kappa = \frac{2\pi}{\hbar}\left(\frac{H_{ab}^2}{\sqrt{4\pi\lambda k_B T}}\right)\exp\left(-\frac{(\Delta G + \lambda)^2}{\sqrt{4\lambda k_B T}}\right)$$

where $\Delta G$ is change in free energy upon charge transfer, $\lambda$ is Marcus reorganization energy, $H_{ab}$ is electronic coupling between molecules, $k_B$ is Boltzmann constant, and T is temperature.

[Mathematical Expression 2]

$$\hbar$$

is Planck's constant.

In calculation of $\kappa$, 512 object molecules were disposed at random, an equilibrium state of the object molecules was calculated by molecular dynamics calculation for several 10 ns at room temperature. From the result obtained by the above calculation, 100 to 200 molecular pairs were arbitrary picked up, and $\kappa$ was calculated by density-functional theory for every picked-up pair.

For the above molecular dynamics calculation, the package Desmond, which was a package for molecular dynamics calculation, was used (K. J. Bowers et al. Proc. 2006 ACM/IEEE Conference on Supercomputing, ACM, Tampa, Fla., 2006, p84). Further, for calculation of A and $H_{ab}$, Jaguar (A. D. Bochevarov et al. Intl. J. Quantum Chem. 113 (2013) 2110), which was calculation software of density-functional theory, was used.

In this way, calculation by a density-functional theory was performed for each molecular pair to obtain 50 to 200 K's values, and to calculate mobility from these values, a method considering percolation described in David R. Evans et al. Organic Electronics 29 (2016) 50 was used.

Specifically, mobility $\mu_{h,p}(p)$ was calculated by the following equation. In the equation, e is an elementary charge.

[Mathematical Expression 3]

$$\mu_{h,p}(p) = \frac{eD_p}{k_B T} \times \theta(p)$$

Further, $D_p$ is given by the equation below.

[Mathematical Expression 4]

$$D_p = \frac{1}{2n}\sum_i D_{h,i} P_i (D_{h,i} \geq D_{th} \text{ for all } i)$$

$P_i$ is given by the equation below.

[Mathematical Expression 5]

$$P_i = \frac{\kappa_i}{\sum_i \kappa_i}$$

Further, $D_{h,i}$ is given by the equation below.

[Mathematical Expression 6]

$$D_{h,i} = \frac{1}{2n} r_i^2 \kappa_i$$

Note that i is a number assigned to each molecular pair. The value $r_i$ is a distance between molecules in the i-th molecular pair.

In addition, the value $D_{th}$ represents an amount satisfying the equation below.

[Mathematical Expression 7]

$$D_p \theta(p) \leq D_{th} \quad (A)$$

In addition, $\theta(p)$ is given by the equation below.

[Mathematical Expression 8]

$$\theta(p) = \left(\frac{p - p_c}{1 - p_c}\right)^v \quad (B)$$

$D_{th}$ was self-consistently determined from Equations (A) and (B). Further, $P_c$ is 0.3116, and v is 2.

The hole mobilities in hetero-substituted fullerenes with respect to the $C_{60}$ structure calculated by this method are shown below.

TABLE 1

|  | Mobility (cm²/Vs) |
| --- | --- |
| $C_{60}$ | 5.0 |
| 1,9-$C_{58}$BN | 17.9 |
| 1,60-$C_{58}$BN | 18.6 |

As shown in Table 1, it was found that, when substitution with a boron atom and a nitrogen atom was performed on fullerene Coo (hole mobility 5.0 cm²/Vs), the hole mobility was improved.

For example, in the following cases, the hole mobility was improved to higher than or equal to 10 cm²/Vs, in particular, preferably improved to higher than or equal to 15 cm²/Vs.

The case where the values n and r are both 1, and the substitution positions of one boron atom and one nitrogen atom are respectively the 1st and 9th positions or respectively the 1st and 60th positions.

Particularly, in the following case, the hole mobility is improved to higher than or equal to 18 cm²/Vs.

The case where the values n and r are both 1, and the substitution positions of one boron atom and one nitrogen atom are respectively the 1st and 60th positions.

The hole mobilities in hetero-substituted fullerenes with respect to the $C_{70}$ structure calculated by the above method are shown below.

TABLE 2

| | Mobility (cm²/Vs) |
|---|---|
| $C_{70}$ | 5.5 |
| 1,2-$C_{68}BN$ | 9.9 |
| 1,70-$C_{68}BN$ | 10.2 |

As shown in Table 2, it was found that, when substitution with one boron atom and one nitrogen atom was performed on fullerene $C_{70}$ (hole mobility 5.5 cm²/Vs), the hole mobility was improved.

For example, in the following cases, the hole mobility is improved to higher than or equal to 7.5 cm²/Vs.

The case where the values n and r are both 1, and the substitution positions of one boron atom and one nitrogen atom are respectively the 1st and 2nd positions or respectively the 1st and 70th positions.

Experimental Example II (Production of Heterofullerene)

Fullerene boride nitride (heterofullerene BN) (the present invention) was synthesized in the following method. A hexane suspension of boron nitride (concentration 0.1 wt %, 10 ml) was added to a hexane suspension of fullerene $C_{60}$ (concentration 0.1 wt %, 10 ml) to prepare a suspension of fullerene $C_{60}$ and boron nitride. This suspension was put in a reaction container made of synthetic quartz and was irradiated with light of KrF excimer laser with a wavelength of 248 nm for 30 minutes in an argon atmosphere. After that, toluene was vaporized and dried to obtain a solid content. An extraction liquid obtained from this solid content by performing Soxhlet extraction using pyridine was separated and refined by high-performance liquid chromatography (HPLC), so that heterofullerene $C_{58}B_1N_1$ ($C_{58}BN$) was obtained.

Heterofullerene $C_{58}BN$ was confirmed to be generated by the fact that a mass peak corresponding to fullerene $C_{58}BN$ whose mass number is 721 was observed in mass spectrometry. This showed that two of the carbon atoms constituting a fullerene Coo were substituted by one boron atom and one nitrogen atom for one molecular. Further, from a result of $C^{13}$-NMR measurement, 1, 9-$C_{58}BN$ was confirmed to be generated.

Example 1 and Comparative Example 1

An oxide film having a film thickness of 350 nm was formed on a silicon wafer by a thermal oxidation process using an oxidation diffusion furnace. On the oxide film, an ITO film (having a thickness of 300 nm), which would be a lower electrode, was formed. Further, on the ITO film, a film of the $C_{58}BN$ (Example 1) synthesized as above or fullerene $C_{60}$ (Comparative Example 1) was formed to have a thickness of 300 nm by a vacuum vapor deposition method. Then, gold, which would be an upper electrode, was vacuum-deposited to make an element for hole mobility evaluation. Regarding Example 1, the content amount of $C_{58}BN$ in the $C_{58}BN$ film was 100 mass % with respect to a total film amount.

The mobility was measured by measuring a voltage dependency of current when a voltage was applied between the lower electrode and the upper electrode. It is known that the voltage dependency of current in such a configuration is given by the space limited charge current below.

[Mathematical Expression 9]

$$I = \frac{9}{8}\varepsilon_0\varepsilon\frac{E^2}{L}\mu$$

Note that in the above equation, I is a drain current, μ is mobility, L is a film thickness, ε is a relative permittivity, $\varepsilon_0$ is a permittivity of vacuum, and E is an electric field in the film. The above equation shows that the mobility can be obtained by measuring the voltage dependency of a current value.

The hole mobility $\mu_1$ of the heterofullerene $C_{58}BN$ film (Example 1) and the hole mobility $\mu_2$ of the fullerene $C_{60}$ film (Comparative Example 1) measured by the above method are shown below being normalized, taking the value ($\mu_2$) of fullerene $C_{60}$ as 1.

Fullerene $C_{60}$ (Comparative Example 1): 1
Heterofullerene $C_{58}BN$ (Example 1): 3.5

As shown above, heterofullerene $C_{58}BN$ has higher hole mobility than fullerene $C_{60}$.

INDUSTRIAL APPLICABILITY

The heterofullerene of the present disclosure has a further sufficiently high hole mobility and is therefore useful as a molecule-based organic semiconductor material or a carbon-based hole transfer material, in particular, a p-type semiconductor material. Therefore, the heterofullerene of the present invention is useful for electronic devices or electronic elements, for example, transistors. The heterofullerene of the present invention can improve frequency characteristics of electronic devices

REFERENCE MARKS IN THE DRAWINGS 1, 17 gate electrode
2, 16 gate insulating film
3, 13 source electrode
4, 14 drain electrode
5, 15 semiconductor film
11 basic transistor structure body
12 base substrate

The invention claimed is:

1. A p-type semiconductor film comprising
   a fullerene $C_{601}$,
   wherein the fullerene $C_{60}$ includes carbon atoms, a single boron atom, and a single nitrogen atom, and
   the single boron atom is a substitution of a carbon atom at position 1 in the fullerene $C_{60}$,
   the single nitrogen atom is a substitution of another carbon atom at position 60 in the fullerene $C_{60}$.

2. A p-type semiconductor film comprising a structure where one of carbon atoms constituting a fullerene $C_{70}$ is substituted by one boron atom and another carbon atom of the carbon atoms constituting a fullerene $C_{70}$ is substituted by one nitrogen atom,
   wherein a substitution position of the one boron atom and a substitution position of the one nitrogen atom are respectively a 1st position and a 2nd position or respectively 1st position and 70th position.

3. An electronic device comprising the p-type semiconductor film according to claim 1.

4. An electronic device comprising:
a source electrode,
a drain electrode,
a gate electrode, and
a semiconductor film,
wherein the semiconductor film is the p-type semiconductor film according to claim 1.

* * * * *